(12) United States Patent
Nishio et al.

(10) Patent No.: US 7,682,936 B2
(45) Date of Patent: Mar. 23, 2010

(54) REDUCTION IN THICKNESS OF SEMICONDUCTOR COMPONENT ON SUBSTRATE

(75) Inventors: Toshihiko Nishio, Shiga (JP); Yasumitsu Orii, Shiga (JP); Yukifumi Oyama, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 11/856,769

(22) Filed: Sep. 18, 2007

(65) Prior Publication Data

US 2008/0067653 A1 Mar. 20, 2008

(30) Foreign Application Priority Data

Sep. 20, 2006 (JP) ............................. 2006-254969

(51) Int. Cl.
*H01L 21/30* (2006.01)
(52) U.S. Cl. ................ 438/459; 438/464; 257/E21.122
(58) Field of Classification Search ................ 438/445, 438/457–459, 464; 257/E21.122
See application file for complete search history.

(56) References Cited

U.S. PATENT DOCUMENTS

2002/0016020 A1 * 2/2002 Usami ........................ 438/106

FOREIGN PATENT DOCUMENTS

| JP | 03-104559 | 5/1991 |
|----|-----------|--------|
| JP | 2001-210781 | 8/2001 |

* cited by examiner

*Primary Examiner*—Thanhha Pham
(74) *Attorney, Agent, or Firm*—Matthew C. Zehrer

(57) ABSTRACT

It is an object to reduce a thickness of a semiconductor component (chip) on a substrate to a predetermined thickness regardless of a variation in thickness of a substrate in a semiconductor product. In a semiconductor product mounted on a base plate, a surface of a semiconductor component on a substrate is set to be located at a predetermined height h from a surface of a base plate. Thereafter, through machining the surface of the semiconductor component which is adjusted to be located at the predetermined height, it is possible to make the thickness of the semiconductor component on the substrate equal to a predetermined thickness.

13 Claims, 3 Drawing Sheets

REDUCTION IN THICKNESS OF SEMICONDUCTOR COMPONENT ON SUBSTRATE

FIELD OF THE INVENTION

The present invention relates to a reduction in a thickness of a semiconductor component on a substrate. The present invention relates to a substrate on which a machine-processed thin semiconductor component is mounted, and a system-in-package (SiP) structure and a package-on-package (PoP) structure, which use the substrate.

SUMMARY OF THE INVENTION

It is an objective of at least one embodiment of the present invention to reduce a thickness of a semiconductor component (chip) on a substrate to a predetermined thickness regardless of a variation in a thickness of a substrate in a semiconductor product.

It is another objective of at least one embodiment of the present invention to individually or simultaneously machine semiconductor components (chips) on a plurality of substrates which do not have exactly the same thicknesses evenly to have a predetermined thickness.

According to at least one embodiment of the present invention, in a semiconductor product mounted on a base plate, a surface of a semiconductor component on a substrate is leveled to a predetermined height from the surface of the base plate. Thereafter, by machining the surface of the semiconductor component adjusted to level to the predetermined height, the thickness of the semiconductor component on the substrate is uniformly made to be a predetermined thickness.

DETAILED DESCRIPTION

Figure 1:
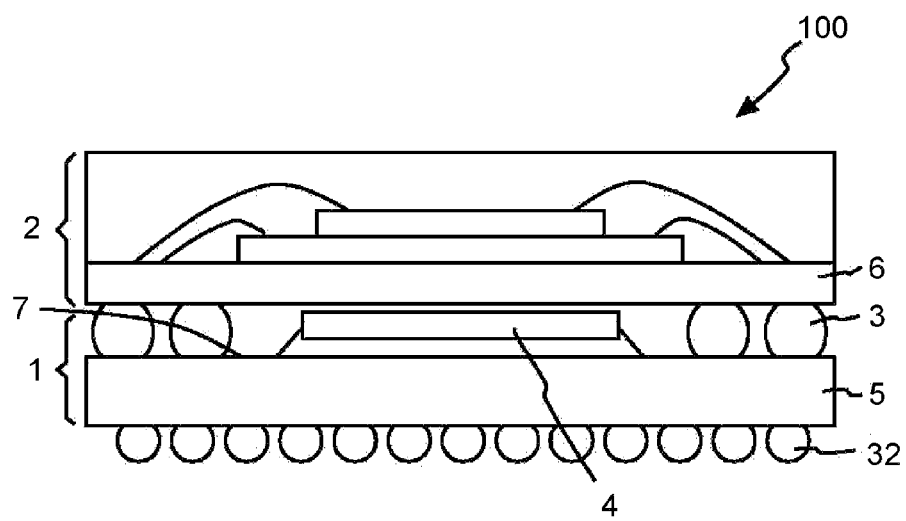
FIG. 1 is a view illustrating an example of a PoP structure.

In recent years, with the use of a system-in-package (hereinafter, referred to as SiP) structure and a package-on-package (hereinafter referred to as PoP) structure, reduction in a space for mounting a semiconductor component (high-density packaging technology) has been developed. FIG. 1 illustrates an example of the PoP structure. In the PoP structure 100, a semiconductor product 1 and a semiconductor product 2 are joined together via solder balls 3. A semiconductor component (chip) 4 of the semiconductor product 1 is located between substrates 5 and 6. As the height of the semiconductor component 4 from a surface 7 of the substrate 5 increases, it is necessary to increase the size of the solder balls 3 in order to prevent the semiconductor component 4 from coming into contact with the substrate 6. However, when increasing the size of the solder balls 3, it is necessary to widen a pitch among the solder balls 3, and this result in a decrease in the number of solder balls within a certain definite range. In recent years, the number of connecting terminals of a semiconductor product has been on an increasing trend. The number of solder balls that serve as connecting terminals of a semiconductor product has been on an increasing trend as well. Therefore, in order to connect two semiconductor products 1 and 2 using a predetermined number of solder balls, it is necessary to increase the outline dimension (substrate size) of the semiconductor products 1 and 2. As a result, it becomes difficult to achieve a reduction in a space for mounting a component (high-density packaging), which is supposed to be an advantage of the PoP structure.

There is a known technique for reducing the thickness of a semiconductor component by machining (for example, polishing, grinding, cutting, and the like) a surface of a semiconductor component on a substrate, and an example thereof is disclosed in Japanese Unexamined Patent Publication (Kokai) No. 2001-210781. However, in the examples disclosed in this publication and so forth, a variation in the thickness of a substrate in machining is not taken into consideration. In case of a substrate in which glass fiber impregnated epoxy resin is used, there is a variation in the thickness of the substrate with approximately +/−10%. For example, in case of a substrate being 0.5 mm thick, the range of variation will be 0.1 mm thick. According to the machining method described in the publication stated above, a bottom surface of a substrate is fixed to a processing board with wax or the like, and then a semiconductor chip is machined.

Figure 2:
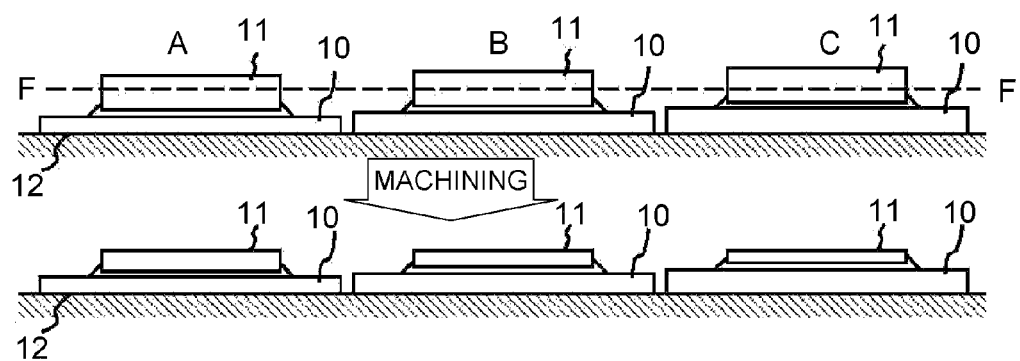
FIG. 2 is a conceptual view illustrating a conventional machining method.

FIG. 2 illustrates a state of semiconductor products in the machining method described in the publication. The upper side of FIG. 2 illustrates three semiconductor products A, B, and C before being machined. The lower part of FIG. 2 illustrates the three semiconductors A, B, and C after being machined. Thicknesses of the substrates of the products A, B, and C increase in the order of A to C. In FIG. 2, since the height of the semiconductor component 11 from the surface 12 after being machined is consistent, the variation in a thickness of the substrates 10 leads to a variation in a thickness of the semiconductor component 11. In other words, a variation in the thickness of the substrate 10 becomes a variation in a thickness of the semiconductor component 11 after being machined.

As illustrated in FIG. 2, when with the semiconductor products fixed as the basis for the bottom surface 12 of the substrate, the three semiconductor components 11 are machined simultaneously, the machining is performed, for example, to the area of a broken line (F-F) in FIG. 2 so as to satisfy a required thickness value for the semiconductor components (for example, the maximum thickness of 0.2 mm). In this case, the thicknesses of the chips of the products A, B, and C decrease in the order of A to C. This causes a variation in thickness (height) of the chips. Machining components one-by-one enables to solve this variation, but this is not realistic since the productivity significantly declines.

Figure 3A:
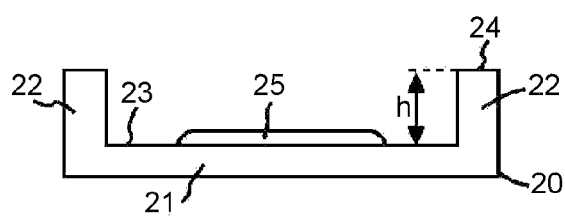
FIGS. 3A to 3H are views illustrating an embodiment of the present invention.

Several embodiments of the present invention will now be described in detail with reference to the drawings. FIGS. 3A to 3H are views explaining a method as an embodiment of the present invention. In FIG. 3A, a first temporary tacking material (fixation material) 25 is applied to a surface 23 of a bottom portion 21 of a fixation device 20. The fixation device 20 contains leg portions 22 in addition to the bottom portion 21. A distance h between the surface 23 of the bottom portion 21 and an end surface 24 of the leg portion 22 has a predetermined length. The distance h, for example, is not supposed to exceed a maximum variation in a thickness of a semiconductor product nor a thickness of a second temporary tacking material (fixation material) (reference numeral 34 in FIG. 3D) of each semiconductor product. The thickness of the first temporary tacking material 25 is a given value over 0 mm. The first temporary tacking material 25 may be applied to a machined surface 30 of the semiconductor product 27. In FIG. 3B, the first temporary tacking material 25 is hardened while the machined surface 30 of the semiconductor component 29 of the semiconductor component 27 remains got into touch with the surface 23 of the bottom portion 21 of the fixation device 20. FIG. 3C illustrates a state after hardening. In FIG. 3D, the second temporary tacking material (fixation material) 34 is applied to a surface 33 of the base plate 32. The second temporary tacking material (fixation material) 34 may be applied to a bottom surface 35 of a substrate 28.

Figure 3E:
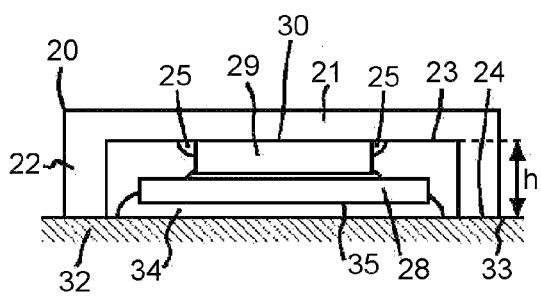
Figure 3B:
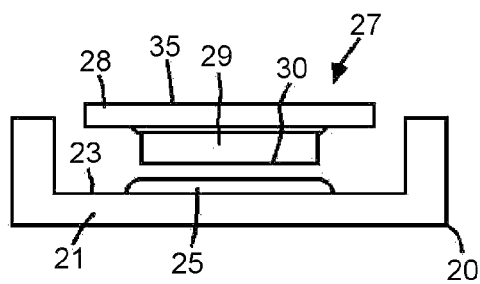
Figure 3F:
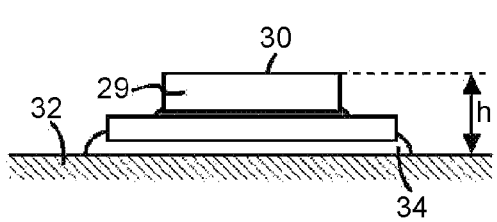
Figure 3C:
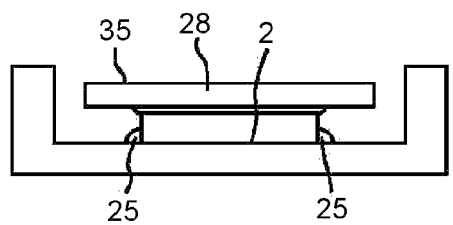

In FIG. 3E, the second temporary tacking material 34 is hardened while the end surface 24 of the leg portions 22 of the fixation device 20 remains got into touch with the surface 33 of the base plate 32, in other words, while the bottom surface 35 of the substrate 28 remains got into touch with the second temporary tacking material 34. Thereafter, the first temporary tacking material 25 is softened (dissolved) while the semiconductor product 27 remains fixed to the surface 33 of the base plate 32. The joining between surface 23 of the bottom portion 21 of the fixation device 20 and the machined surface 30 of the semiconductor component 29 is released. The fixation device 20 is removed from the surface 33 of the base plate 32. FIG. 3F illustrates a state after the fixation device 20 is removed (separated). In FIG. 3F, the height of the machined surface 30 of the semiconductor component 29 is maintained to be at h.

Figure 3G:
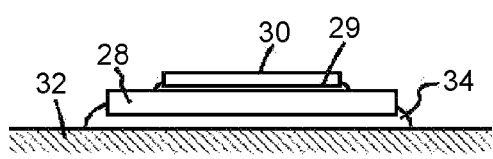
Figure 3D:
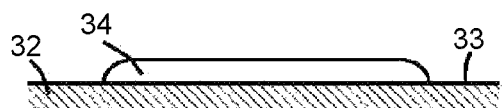
Figure 3H:

In FIG. 3G, the machined surface 30 of the semiconductor component 29 exposed on the base plate 32, is machined. Machining process makes the semiconductor component 29 to have a predetermined thickness. The machining process is performed with the use of a normal semiconductor machining method (for example, polishing, grinding, cutting, and the like). Since the machining process is conducted after the height of the machined surfaces 30 is coordinated to a uniform level, it is possible to absorb (complement) a variation in a thickness of the substrates 28 by the second temporary tacking material 34, and to make a thickness of the semiconductor components 29 to be a uniform thickness after the machining process. In FIG. 3H, the second temporary tacking material 34 is softened (dissolved). The joint between the second temporary tacking material 34 on the base plate 32 and the substrate 28 is released. The semiconductor product 27 is removed from the base plate 32.

The first temporary tacking material 25 and the second temporary tacking material 34 are materials that are hardened in different methods or the same method. Further, these two materials are material that can be exfoliated (dissolved) by different methods. Alternatively, in case that these materials are capable of being exfoliated (dissolved) by a similar method, the materials which do not react (dissolve) should be used as the second temporary tacking material 34 under a condition that the first temporary tacking material 25 reacts (dissolves). For example, in case that the material is exfoliated by being soused in warm water, the material of the first temporary tacking material 25 should be a material reacting (dissolving) in warm water at lower temperature than the material of the second temporary tacking material 34.

In case that the first temporary tacking material 25 is a kind of material which is hardened by light such as an ultraviolet ray, the fixation device 20, at least the bottom portion 21 thereof, needs to be made of a light transmitting material. Similarly, in case that the second temporary tacking material 34 is a kind of material that is hardened by light such as an ultraviolet ray, the base plate 32 needs to be made of a light transmitting material. When joining strength between the base plate 32 and the second temporary tacking material 34 is reduced, the surface 33 of the base plate 32 is roughened so that the surface 33 may be exerted the anchor effect on, resulting in the increase in the joining strength. However, since light transmission comes down depending on dents or projections on the surface, it is necessary to adjust the surface roughness and a condition of ultraviolet irradiation.

For the first temporary tacking material 25, 30Y-593 series produced by Three Join Co., Ltd. may be used. For the second temporary tacking material 34, for example, 30Y-608 series and TB 3046 by ThreeBond Co., Ltd., Temploc series by Denki Kagaku Kogyo Kabushiki Gaisya, and ADFIX series produced by Nikka Seiko Co., Ltd. may be used.

Figure 4:
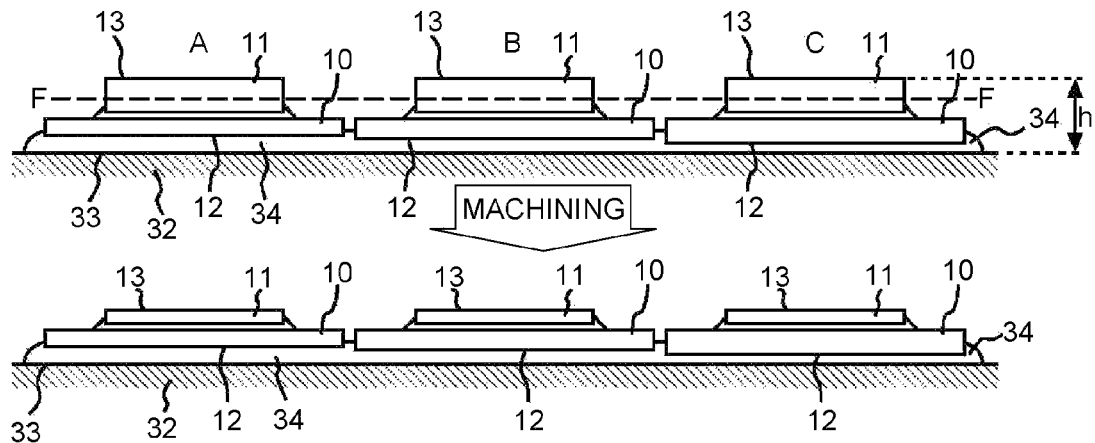
FIG. 4 is a view illustrating a state where the method of the present invention is applied to three semiconductor products A, B, and C in FIG. 2.

FIG. 4 illustrates a state where the method of the present invention is applied to the three semiconductor products A, B, and C in FIG. 4. Not like in FIG. 2, there exists the second temporary tacking material 34 between the surface 33 of the base plate 32 and the bottom surface 12 of the substrate 10. The volumes of the second temporary tacking material 34, in all the semiconductor products A, B, and C, causes the height of the machined surface 13 of the semiconductor components 11 from the surface of the base plate 32 to be maintained to be at h. Therefore, machining the surface to the level of the broken line (F-F) regardless of the variation in thickness of the substrates 10 enables to uniform the thickness of all the semiconductor components 11 of the semiconductor products A, B, and C after being machined.

In the steps illustrated in FIGS. 3A to 3H, the second temporary tacking material 34 is preferably a material having as close adhesion strength and exfoliating time as possible relative to both the substrate 28 and the base plate 32, respectively. However, depending on the material and shape of the substrate 28, reduction of adhesion strength or extension of exfoliating time can happen. In order to solve this problem, it is also possible to provide a fixation material (for example, a soluble material) with different properties between the second temporary tacking material 34 and the substrate 28. The reason is because this enables to enhance the adhesion strength to the substrate 28, or to facilitate exfoliation of the substrate 28 easily. To be more specific, the soluble material is applied to the surface 35 of the substrate 28 in FIG. 3B. This soluble material is a material soluble in water, alcohol, or an alkaline solution, but is a material not soluble during each of the steps in FIG. 3A to 3H. Thereafter, the steps of FIGS. 3A to 3H proceed using the substrate 28 on which the soluble material is applied. In FIG. 3H, the soluble material on the substrate 28 is dissolved instead of dissolving the second temporary tacking material 34. Then, the joint between the second temporary tacking material 34 and the substrate 28 is released. The semiconductor product 27 is removed from the base plate 32.

Figure 5A:
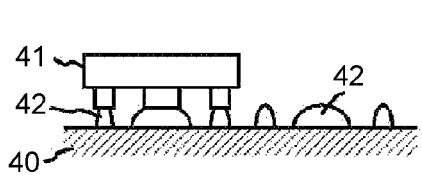
FIGS. 5A to 5F are views illustrating another embodiment of the present invention.
Figure 5B:
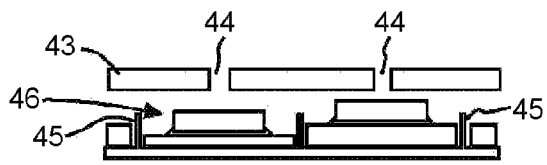
Figure 5C:
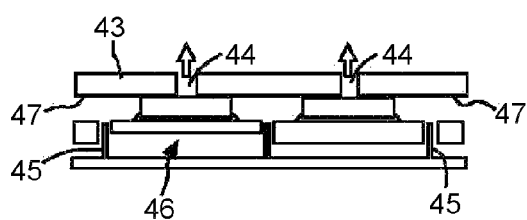
Figure 5D:
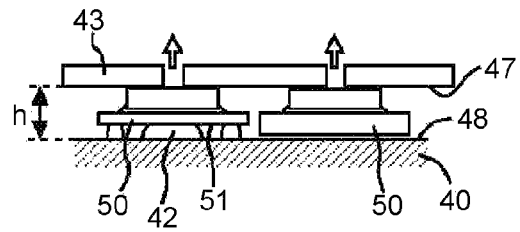

FIGS. 5A to 5F illustrate other embodiments of the present invention. In FIG. 5A, a temporary tacking material 42 is applied to a base plate 40 by using a dispenser. The application is provided to necessary areas depending on a size of a semiconductor product 46. In FIG. 5B, a suction plate 43 is prepared. In the suction plate 43, a plurality of openings 44 is provided for sticking the semiconductor products 46. In addition, the semiconductor products 46 aligned on trays 45 are prepared. In FIG. 5C, the suction plate 43 is brought closer to the trays 45 to suck (vacuum up) the semiconductor products 46 via the plurality of openings 44, and this causes the semiconductor products 46 to stick to the lower surface 47 of the suction plate 43. In FIG. 5D, the suction plate 43 to which the semiconductor products 46 are stuck is moved to the top of the base plate 40 to which the temporary tacking material 42 is applied. At this time, the position of the suction plate 43 is adjusted so that the lower surface 47 of the suction plate 43 is located at a predetermined height h from the surface 48 of the base plate 40. Here, lower surfaces 51 of the substrates 50 get into touch with the temporary tacking material 42.

Figure 5E:
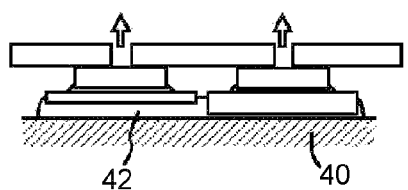
Figure 5F:
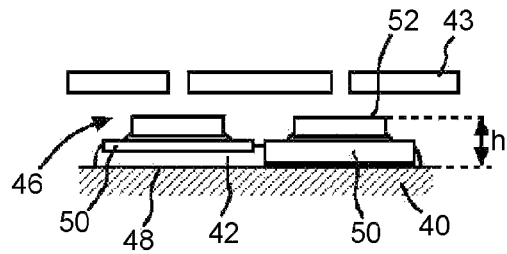

In FIG. 5E, the temporary tacking material 42 is hardened. If the temporary tacking material 42 is a kind of material which is hardened by light such as an ultraviolet ray, a light transmitting material such as glass is selected as the transparent base plate 40 to harden the temporary tacking material 42 with the light irradiated from the bottom surface of the base plate 40. If the temporary tacking material 42 is a kind of material which is hardened by heat, the temporary tacking material 42 is heated from outside. In FIG. 5F, vacuuming up from the suction plate 43 is released, and the suction plate 43 and the semiconductor products 46 are separated from each other. A distance between machined surfaces 52 of the semiconductor products 46 after separation and the surface 48 of the base plate 40 is maintained to be at h. Thereafter, as in the case of FIG. 3G, the machined surfaces 52 of the semiconductor products 46 (semiconductor components) are machined to thin the semiconductor components. Further, as in the case of FIG. 3H, the temporary tacking material 42 is softened (dissolved), and joint between the temporary tacking material 42 on the base plate 40 and the substrates 50 is released. The semiconductor products 46 are removed from the base plate 40. The method described in FIGS. 5A to 5F is effective when thinning a large number of semiconductor products (semiconductor components) by machining the surfaces thereof. The method in FIGS. 5A to 5F is appropriate for mass production or automation.

<Proving Effects>

Table 1 illustrates comparison data of variation in thicknesses of semiconductor chips in the conventional method (FIG. 2) and the novel method (FIGS. 3A to 3H). According to the conventional method, there was a variation of 30 micron in thicknesses of silicon chips after machining. On the other hand, in case of the method of the present invention, it was confirmed that a variation was reduced to 2 micron. The samples used for this confirmation were semiconductor products formed by joining a 7.3 mm-square semiconductor chips to a 20-mm square substrate. Further, a heat cycle test (−40 degrees centigrade to +115 degrees centigrade, 2 cph, n=20) was conducted on the samples that were machined according to the method of the present invention, and any electrical or mechanical defects did not occur until the 6500 cycle.

The present invention has been described with reference to the drawings. However, the present invention should not be limited to these embodiments. It should be apparent to those skilled in the art that any modifications may be possible without departing from the gist of the present invention.

What is claimed is:

1. A method for reducing a thickness of a semiconductor component on a substrate, the method comprising the steps of:
preparing a base plate;
preparing a substrate on which a semiconductor component is mounted;
preparing a fixation device including a bottom portion and leg portions, in which a distance between a surface of the bottom portion and an end surface of each of the leg portions has a predetermined length;
temporarily tacking the substrate to the fixation device using a first fixing material that is made of a light-curable material so that a surface of the semiconductor component may join the surface of the bottom portion of the fixation device;
placing the fixation device to which the substrate is temporarily tacked onto a surface of the base plate, and further temporarily tacking a surface of the substrate on the side where the semiconductor component is not mounted to the surface of the base plate using a second fixing material that is made of a light-curable material;
releasing the temporary tacking between the fixation device and the semiconductor component, and removing the fixation device from the surface of the base plate;
machining the exposed surface of the semiconductor component on the base plate; and
releasing the temporary tacking between the substrate after being machined and the surface of the base plate, and separating the substrate and the base plate from each other.

2. The method according to claim 1,
wherein the step of temporarily tacking the substrate to the fixation device includes the steps of:
applying the first fixing material on the surface of the bottom portion of the fixation device;
joining the surface of the semiconductor component to the surface of the bottom portion of the fixation device to which the first fixing material is applied; and
hardening the first fixing material using light after the joint.

TABLE 1

Variation in thicknesses of semiconductor chips
unit: μm

| | Conventional Method | 1 | 2 | 3 | 4 | 5 | Average | Range |
|---|---|---|---|---|---|---|---|---|
| Before machining | Silicon thickness (*1) | 0.726 | 0.724 | 0.723 | 0.725 | 0.728 | 0.725 | 0.005 |
| | Substrate thickness (*2) | 0.383 | 0.395 | 0.368 | 0.388 | 0.371 | 0.381 | 0.027 |
| | Module thickness (*2) | 1.142 | 1.155 | 1.125 | 1.152 | 1.134 | 1.142 | 0.030 |
| After machining | Module thickness | 0.468 | 0.470 | 0.471 | 0.468 | 0.468 | 0.469 | 0.003 |
| | Silicon thickness (*3) | 0.052 | 0.039 | 0.069 | 0.01 | 0.062 | 0.053 | 0.030 |
| | Present Invention | 6 | 7 | 8 | 9 | 10 | Average | Range |
| Before machining | Silicon thickness (*1) | 0.728 | 0.724 | 0.725 | 0.724 | 0.725 | 0.725 | 0.004 |
| | Substrate thickness (*2) | 0.391 | 0.388 | 0.375 | 0.366 | 0.381 | 0.380 | 0.025 |
| | Module thickness (*2) | 1.155 | 1.145 | 1.137 | 1.138 | 1.138 | 1.140 | 0.032 |
| After machining | Module thickness | 0.498 | 0.491 | 0.481 | 0.483 | 0.483 | 0.485 | 0.028 |
| | Silicon thickness (*3) | 0.071 | 0.070 | 0.069 | 0.070 | 0.070 | 0.070 | 0.002 |

(*1): Value obtained by measuring thickness before performance
(*2): Value obtained by measuring thickness after performance
(*3): Values obtained by calculating from the amount of changes made by machining and thicknesses before machining 3. The method according to claim 1,
wherein the step of temporarily tacking the substrate to the fixation device includes the steps of:
applying the first fixing material to the surface of the semiconductor component;
joining the surface of the semiconductor component, to which the first fixing material is applied, to the surface of the bottom portion of the fixation device; and
hardening the first fixing material using light after the joint.

4. The method according to claim 2,
wherein the step of temporarily tacking the surface of the substrate to the surface of the base plate includes the steps of:
applying the second fixing material to the surface of the base plate;
joining the surface of the substrate on the side on which the semiconductor component is not mounted to the surface of the base plate to which the second fixing material is applied; and
hardening the second fixing material using light after the joint.

5. The method according to claim 2,
wherein the step of temporarily tacking the surface of the substrate to the surface of the base plate includes the steps of:
applying the second fixing material to the surface of the substrate on the side on which the semiconductor component is not mounted;
joining the surface of the substrate to which the second fixing material is applied on the side on which the semiconductor component is not mounted, to the surface of the base plate; and
hardening the second fixing material using light after the joint.

6. The method according to claim 4,
wherein the base plate is made of a light transmitting material, and
the step of hardening the second fixing material includes the step of exposing the substrate to a light via the base plate.

7. The method according to claim 6,
wherein the step of releasing the temporary tacking between the fixation device and the semiconductor component includes a step of exfoliating the first fixing material from a surface of the semiconductor component by sousing the hardened first fixing material in warm water, and
the step of releasing the temporary tacking between the substrate after being machined and the surface of the base plate includes a step of exfoliating the second fixing material from the substrate by sousing the hardened second fixing material in warm water.

8. The method according to claim 7,
wherein a temperature of softening the first fixing material is lower than a temperature of softening the second fixing material.

9. The method according to claim 4,
wherein the step of preparing the substrate on which the semiconductor component is mounted includes the step of applying a third fixing material to the surface of the substrate on the side on which the semiconductor component is not mounted; and,
the method further includes the step of removing the third fixing material from the surface of the substrate after the step of separating the substrate and the base plate from each other.

10. A method for reducing a thickness of a semiconductor component on a substrate, the method comprising the steps of:
preparing a base plate;
preparing a substrate on which a semiconductor component is mounted;
preparing a fixation device including a bottom portion and leg portions, in which a distance between a surface of the bottom portion and an end surface of each of the leg portions has a predetermined length, the bottom portion of the fixation device having at least one opening;
temporarily tacking the substrate to the fixation device and further joining the surface of the semiconductor component to the surface of the bottom portion of the fixation device by aspirating the surface of the semiconductor component via the opening in the bottom potion of the fixation device;
placing the fixation device to which the substrate is temporarily tacked onto a surface of the base plate, and further temporarily tacking a surface of the substrate on the side where the semiconductor component is not mounted to the surface of the base plate using a second fixing material that is made of a light-curable material;
releasing the temporary tacking between the fixation device and the semiconductor component, and removing the fixation device from the surface of the base plate;
machining the exposed surface of the semiconductor component on the base plate; and
releasing the temporary tacking between the substrate after being machined and the surface of the base plate, and separating the substrate and the base plate from each other.

11. The method according to claim 10,
wherein the step of temporarily tacking the surface of the substrate to the surface of the base plate includes the steps of:
applying the second fixing material to the surface of the base plate;
joining the surface of the substrate on the side on which the semiconductor component is not mounted to the surface of the base plate to which the second fixing material is applied; and
hardening the second fixing material using light after the joint.

12. The method according to claim 11,
wherein the base plate is made of a light transmitting material, and
the step of hardening the second fixing material includes the step of exposing the substrate to a light via the base plate.

13. The method according to claim 12,
wherein the step of releasing the temporary tacking between the substrate after being machined and the surface of the base plate includes a step of exfoliating the second fixing material from the substrate by sousing the hardened second fixing material in warm water.

* * * * *